(12) United States Patent
Yang

(10) Patent No.: US 6,852,609 B2
(45) Date of Patent: Feb. 8, 2005

(54) METHOD OF FORMING A POLYCRYSTALLINE SILICON LAYER

(75) Inventor: Myoung-Su Yang, Kunpo-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 140 days.

(21) Appl. No.: 09/748,871

(22) Filed: Dec. 28, 2000

(65) Prior Publication Data

US 2001/0019863 A1 Sep. 6, 2001

(30) Foreign Application Priority Data

Dec. 31, 1999 (KR) .......................................... 1999-67846

(51) Int. Cl.⁷ .......................... H01L 21/20; H01L 21/36; H01L 21/26; H01L 21/477
(52) U.S. Cl. ......................... 438/487; 438/488; 438/799
(58) Field of Search ................................. 438/155, 487, 438/799, 663, 638

(56) References Cited

U.S. PATENT DOCUMENTS

| | | | | |
|---|---|---|---|---|
| 4,059,461 A | * | 11/1977 | Fan et al. | |
| 4,267,011 A | * | 5/1981 | Shibata et al. | |
| 4,409,724 A | * | 10/1983 | Tasch, Jr. et al. | |
| 6,194,023 B1 | * | 2/2001 | Mitsuhashi et al. | |

FOREIGN PATENT DOCUMENTS

| | | | |
|---|---|---|---|
| JP | 409283441 A | * | 10/1997 |
| JP | 410065205 A | * | 3/1998 |

* cited by examiner

Primary Examiner—John F. Niebling
Assistant Examiner—Ron Pompey
(74) Attorney, Agent, or Firm—McKenna Long & Aldridge LLP

(57) ABSTRACT

A method of forming a polycrystalline silicon layer. An amorphous silicon layer on a substrate is completely melted using a laser beam passed through a mask so as to form a polycrystalline silicon layer. The upper portion of the polycrystalline silicon layer is then re-melted and re-crystallized using a laser beam passed through a mask. The mask includes a high transmittance region for completely melting the amorphous silicon layer and a low transmittance region for re-melting the upper portion of the polycrystalline silicon layer.

10 Claims, 7 Drawing Sheets

METHOD OF FORMING A POLYCRYSTALLINE SILICON LAYER

CROSS REFERENCE

This application claims the benefit of Korean Patent Application No. 1999-67846, filed on Dec. 31, 1999, under 35 U.S.C. §119, the entirety of which is hereby incorporated by reference.

BACKGROUND OF THE INVENTION

1. Field of the Invention

The present invention relates to a method of forming a polycrystalline silicon layer for a switching element, for example, a thin film transistor (TFT).

2. Description of Related Art

A thin film transistor (TFT) includes an insulating layer, a passivation film, electrode layers and a semiconductor layer. The insulating layer is beneficially comprised of SiNx, $SiO_2$, $Al_2O_3$ or TaOx. The passivation film is beneficially comprised of a transparent organic insulating material or of a transparent inorganic insulating material. The electrode layers include a gate electrode, a source electrode, and a drain electrode, and are beneficially comprised of a conductive metal such as Al, Cr or Mo. The semiconductor layer acts as a channel region along which charges flow. The semiconductor layer is usually comprised of amorphous silicon or polycrystalline silicon.

A process of forming the semiconductor layer using amorphous silicon can be performed at a low temperature of about 350° C. and is relatively simple. However, since a field effect mobility of an amorphous silicon layer can be as low as 2 cm$^2$/V·sec, the switching characteristics of the TFT are not particularly good.

A polycrystalline silicon layer has a much better speed of response than an amorphous silicon layer. A polycrystalline silicon layer can have a field effect mobility between 20 cm$^2$/V·sec to about 550 cm$^2$/V·sec. As the switching speed of a TFT depends on the field effect mobility, the switching speed of a TFT having a polycrystalline silicon layer is about 100 times as fast as that of a similar TFT having an amorphous silicon layer. The higher field effect mobility is a result of the better grains in a polycrystalline silicon layer as compared to those of an amorphous silicon layer.

Methods of forming polycrystalline silicon layers include an excimer laser annealing technique, a solid phase crystallization (SPC) technique, and a metal-induced crystallization (MIC) technique.

Excimer laser annealing is usually performed at a low temperature and, thus a low-cost glass substrate can be used. A TFT manufactured using the excimer laser annealing technique usually has a field effect mobility of more than 100 cm$^2$/V·sec, and thus has excellent operating characteristics.

The solid phase crystallization technique is one in which amorphous silicon is crystallized at a high temperature, usually over 600° C. Since crystallization is performed at a solid phase, a grain can have defects such as a micro-twin, a dislocation, and the like. Grains obtained using solid phase crystallization are usually of a low grade. In order to compensate for this, a thermal oxidation film formed at about 1000° C. is usually used as a gate insulating layer. Therefore, a high-cost material, such as quartz, is required for the substrate. This presents a problem in that production costs are high.

In the metal-induced crystallization technique, crystallization is performed by depositing a metal layer on an amorphous silicon layer which is then heat treated. The metal layer lowers the enthalpy of the amorphous silicon layer. As a result, crystallization is possible at a low temperature of about 500° C. However, the resulting surface state and electrical characteristics are not particularly good, and the resulting grains can have many defects.

A polycrystalline silicon layer manufactured using the techniques described above can obtain grains from silicon seeds formed while the silicon, in a liquid state, cools. If a silicon grain grows laterally, large-sized grains can be obtained. If the distance between adjacent silicon seeds is greater than the maximum silicon growth distance, a silicon grain grows laterally with the silicon seed at the center of the grain. After the silicon grain grows to its maximum length, nuclei generated by super-cooling create many small-sized grains. However, if the distance between adjacent silicon seeds is less than the maximum silicon growth distance, large sized grains that meet at grain boundaries are formed. To obtain a high-quality TFT, large-sized grains should be uniformly arranged while forming grain boundaries.

FIGS. 1A to 1C are plan views illustrating a crystallization process of a polycrystalline silicon layer. The distance between adjacent silicon seeds 11 is less than the maximum grain growth distance. It is desirable that the silicon seeds 11 are uniformly distributed. The silicon grains 13 grow laterally, centering on the silicon seed 11, and complete their growth after forming grain boundaries 15.

Hereinafter, a crystallization process using the excimer laser annealing technique according to a conventional art is explained in more detail.

FIG. 2 is a perspective view illustrating a configuration of polycrystalline silicon crystallization equipment using the excimer laser annealing technique. The equipment includes a laser beam device (not shown), a mask 33, and a projection lens 35. The projection lens 35 is arranged over a substrate 31, and the mask 33 is aligned with the projection lens 35. When a laser beam 37 is projected from the laser beam device toward the mask 33, the laser beam 37 becomes incident on the mask. The laser beam incident to the mask 33 passes through the projection lens 35 and is concentrated on the substrate 31, which has an amorphous silicon layer. Polycrystallization of the amorphous silicon layer is performed according to the mask pattern.

At this point, a growth of the polycrystalline grain is controlled by the shape and energy density of the laser beam, and by the temperature and cooling rate of the substrate. During crystallization, a silicon grain has three regions: a low energy density region; an intermediate energy density region; and a high energy density region. The low energy density region is a partially melted region. That is, the lower energy density region is one in which the lower portion of the silicon layer is not melted, and thus the silicon melting depth is less than the thickness of the silicon layer. The resulting grain diameter is less than the thickness of the silicon layer because seeds on the lower portion of the silicon layer tend to grow vertically.

The intermediate energy density region is an almost completely melted region. That is, the intermediate energy density is one which only some of seeds on the lower portion of the silicon layer are not completely melted. Except for those seeds, almost all of the silicon layer is completely melted. This region is a region in which lateral growth, centered on the seeds, is possible.

The high energy density region is one in which even the lowest portion of the silicon layer is completely melted.

A crystallization method using the polycrystalline silicon crystallization equipment of FIG. 2 is as follows. The laser beam 37 is uniformed by predetermined means. Thereafter, the laser beam that will be formed on the substrate 31 is determined by the mask 33. A laser beam having a width of tens of μm is formed through the projection lens 35. The substrate 31 is arranged on a stage that moves slowly, usually at a speed of less than 1 μm/pulse, so that crystallization is performed by the laser beam. The mask 33 has divided stripe shape regions "A", "B", and "C".

FIG. 3 is a plan view illustrating a mechanism for laser crystallization of amorphous silicon. In a first crystallization step, shown in element 45, lateral growth occurs by moving the substrate 31. In the second crystallization step, also shown in element 45, a grain boundary 41 formed in the first step moves and forms a new grain boundary 41a. Preferably, a high energy density that completely melts the silicon is used, and the width of the laser beam is less than twice the maximum lateral growth distance.

The step and melt process continues. After an n-th crystallization step, grains 43 of the polycrystalline silicon that were crystallized by the lateral growth are large, and the grain boundary 41n is finally determined.

FIG. 4 is an enlarged view illustrating a portion D of FIG. 3. As shown in FIG. 4, the polycrystalline silicon layer has a protruding portion 45 that protrudes upwardly. The protruding portion is formed on the grain boundary due to growth of adjacent grains. This result comes about because solid silicon is greater in volume than liquid silicon, and the silicon layer melted last is cooled at the grain boundary region, increasing its volume. The protruding portion 45 has a height of about 300 Å.

Further, when the silicon layer is crystallized using the conventional crystallization described above, as shown in FIG. 5, defects 51, each referred to as a low angle defect, may exist on the surface of the layer. This result comes about because the heat energy contained in the silicon layer is suddenly exhausted via the substrate below the silicon layer when the laser beam is blocked.

The defects on the surface of the silicon layer result from sudden cooling, leading to abnormal grain growth.

A polycrystalline silicon layer manufactured by the above-described method is usually patterned to form a channel in subsequent processes. Then, an insulating layer is formed on the polycrystalline silicon layer. In other words, since the insulating layer is formed on a non-flat surface due to grain defects and the grain boundary protruding upwardly, a trap level may occur due to a mismatch between the polycrystalline silicon layer and the insulating layer. The result is that the field effect mobility of charges that flow along a surface of the polycrystalline silicon layer is significantly lowered, leading to low reliability.

SUMMARY OF THE INVENTION

To overcome the problems described above, preferred embodiments of the present invention provide a method of forming a polycrystalline silicon layer having excellent electrical characteristics.

In order to achieve the above object, the preferred embodiments of the present invention provide a method of forming a polycrystalline silicon layer, comprising: forming an amorphous silicon layer on a substrate, melting the amorphous silicon layer by passing a laser beam through a mask so as to form a polycrystalline silicon layer; and re-melting an upper portion of the polycrystalline silicon layer by passing a laser beam through a mask so as to recrystallize the upper portion of the polycrystalline silicon layer.

The mask used for crystallization causes the formation of a completely melted region and a partially melted region, wherein the completely melted region and the partially melted region have stripe shapes. The completely melted region and the partially melted region are postioned in series. The portion of the mask that causes a completely melted region is made of a material having a high light transmittance, and the portion of the mask that causes a partially melted region is made of a material having a low light transmittance. Crystallization is beneficially performed using a scanning process of moving the substrate having the amorphous silicon layer under the laser beam.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF A PREFERRED EMBODIMENT

Reference will now be made in detail to a preferred embodiment of the present invention, an example of which is illustrated in the accompanying drawings.

The forming method for a thin film transistor is follows. First, a gate electrode and a gate line (not shown) are formed on a substrate (not shown). Thereafter, an insulating layer of SiNx or $SiO_2$ is formed over the whole surface of the substrate. An amorphous silicon layer is then deposited on the insulating layer. If the amorphous silicon layer is made of hydrogenized amorphous silicon, a dehydrogenation process is performed to remove hydrogen before crystallization. This is because pores, which may reduce the electrical characteristics of the polycrystalline silicon layer, may be formed while hydrogen is removed during crystallization.

Figure 1A:
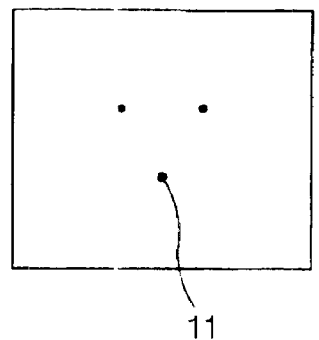
FIGS. 1A to 1C are plan views illustrating a typical crystallization process of a polycrystalline silicon layer.
Figure 1B:
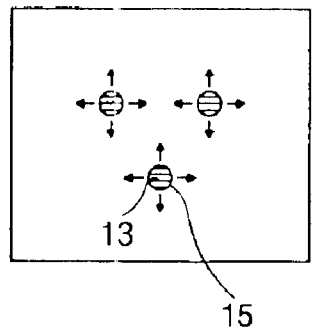
Figure 1C:
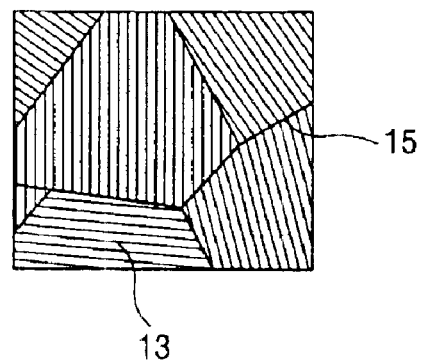
Figure 2:
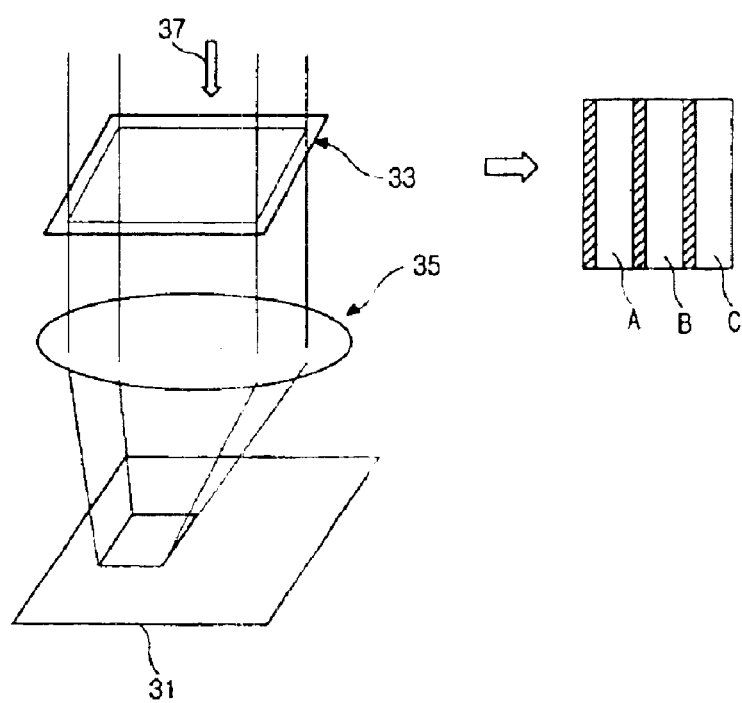
FIG. 2 is a schematic perspective view illustrating a configuration of a polycrystalline silicon crystallization equipment using the excimer laser annealing technique.
Figure 3:
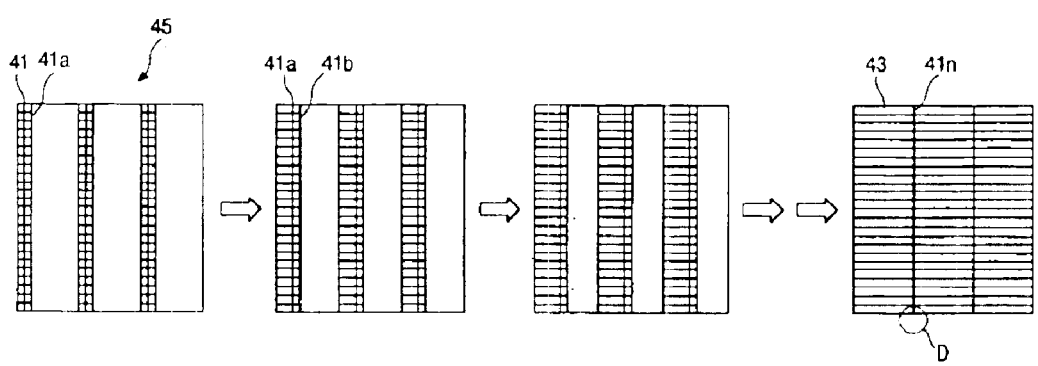
FIG. 3 is a plan view illustrating a mechanism of crystallizing an amorphous silicon layer using the polycrystalline silicon crystallization equipment of FIG. 2.
Figure 4:
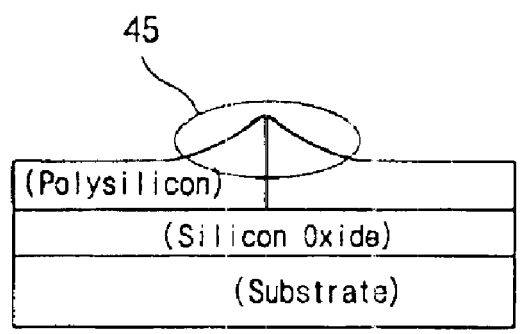
FIG. 4 is an enlarged side view of "D" portion of FIG. 3.
Figure 5:
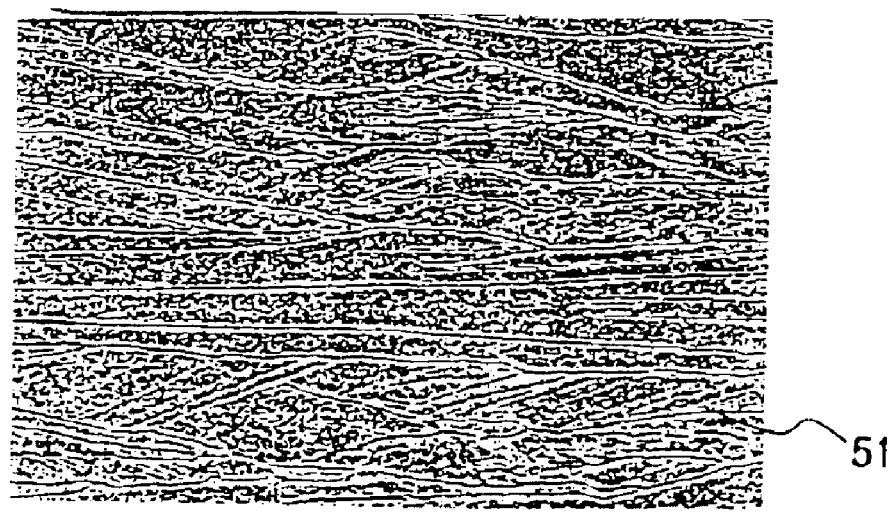
FIG. 5 is a detailed plan view illustrating a surface of a polycrystalline silicon layer formed according to a conventional method.
Figure 6:
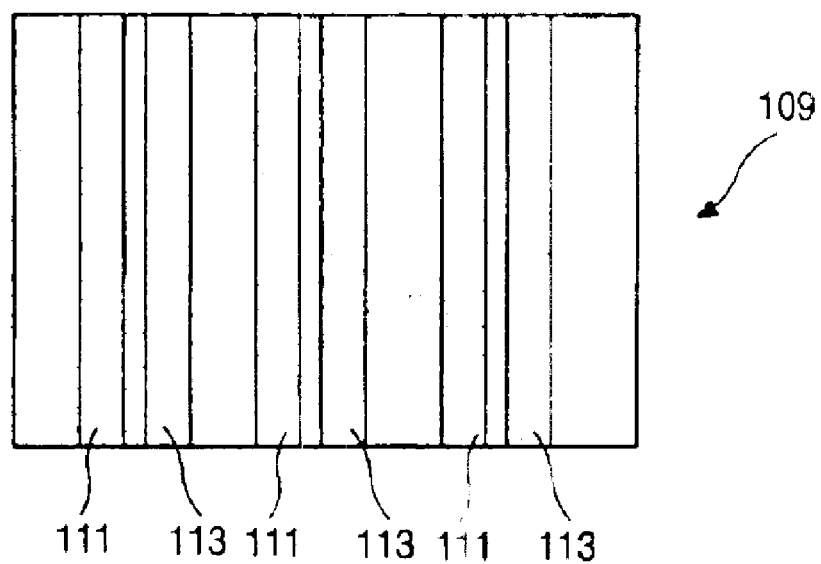
FIG. 6 is a plan view illustrating a laser beam mask pattern according to an embodiment of the invention.

The amorphous silicon layer is then crystallized using the mask pattern 109 shown in FIG. 6. Lateral growth forms the polycrystalline silicon layer. The mask pattern 109 includes a sequence of partially melting regions 111 and completely melting regions 113. On the partially melting regions 111 a coating film having a low light transmittance is formed. The completely melting region 113 has good light transmittance. Therefore, a laser beam that pass through the partially melting regions 111 and the completely melting regions 113 becomes beams having different energy intensities. The partially melting regions 111 correspond to a low density energy region that melts the silicon layer less than its full depth. The result is that only an upper portion of the polycrystalline silicon layer is melted by the partially melting regions 111. The completely melting regions 113 correspond to the high energy density regions. A laser beam that passes through a completely melting region 113 has a width of about 2 μm and completely melts the amorphous silicon layer such that lateral growth can be sequentially performed. The completely melting regions 113 and the partially melting regions 111 have stripe shapes. The completely melting region 113 advances the partially melting region with respect to the scanning direction.

Figure 7:
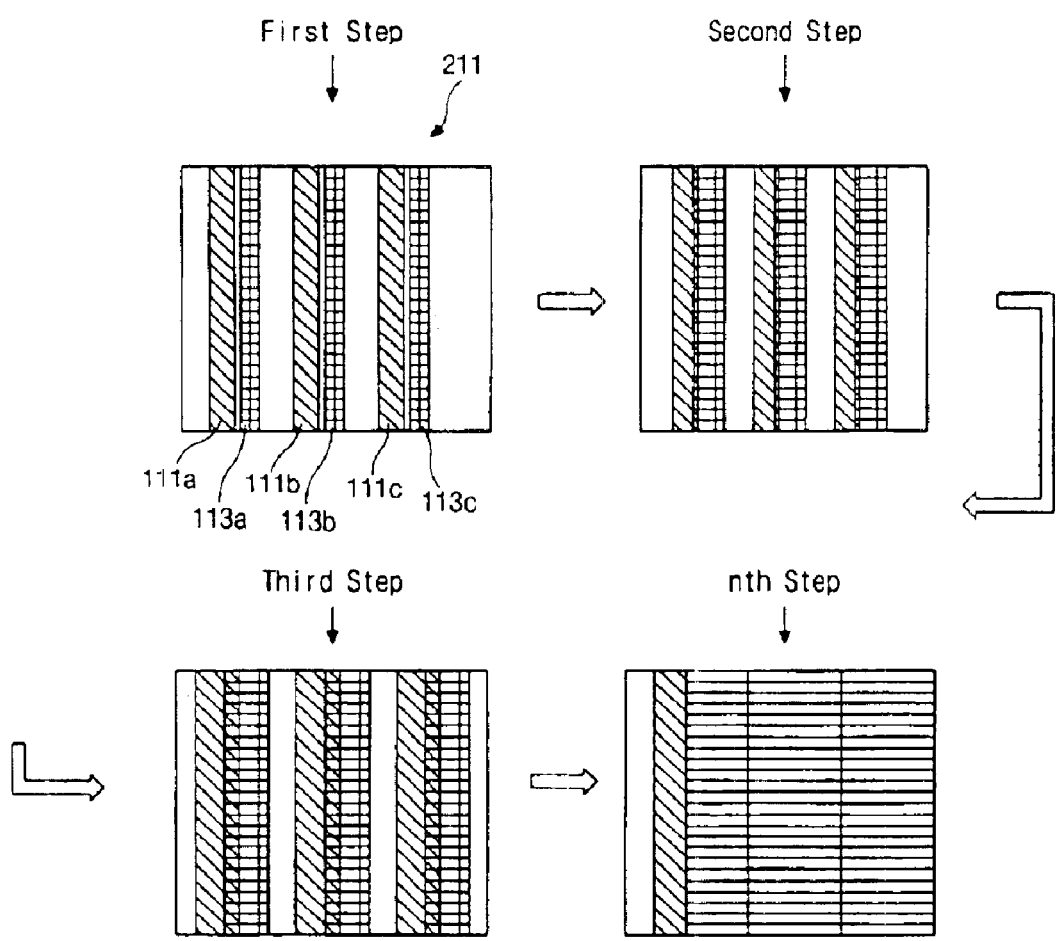
FIG. 7 is a plan view illustrating a crystallization process according to the embodiment of the invention.

Hereinafter, a method of forming a polycrystalline silicon layer having a flat surface according to the preferred embodiment of the present invention is explained with reference to FIG. 7. As shown in FIG. 7, during a first laser annealing process, the laser beam scans an amorphous silicon layer deposited on a substrate 211 using the mask pattern 109. Portions 113a, 113b and 113c of the silicon layer are completely melted by the laser beam via the completely melting region 113, and other portions 111a, 111b and 111c of the silicon layer are partially melted by the laser beam via the partially melting region 111 of the mask pattern 109 (FIG. 6).

Subsequently, by moving the substrate 211, the polycrystalline silicon layer that is formed by the completely melting region 113 of the mask pattern 109 is scanned by the laser beam that passes through the partially melting region 111 of the mask pattern 109, so that upper portions of the firstly completely melted portions 113a, 113b and 113c of the polycrystalline silicon layer is re-crystallized up to a predetermined depth. Therefore, a polycrystalline silicon layer having grains with no defects and a flat surface can be manufactured. By moving the substrate sequentially, the complete melted portions 113a, 113b and 113c are fully re-crystallized by the laser beam via the partially melting region 111 of the mask pattern 109. That is, the partial melting is sequentially performed at the same time, and the crystallization process is completed at an nth laser annealing process. The scanning process is completed when all the completely melted portions are over scanned by the laser beam via the partially melting regions of the mask pattern 109.

Figure 8:
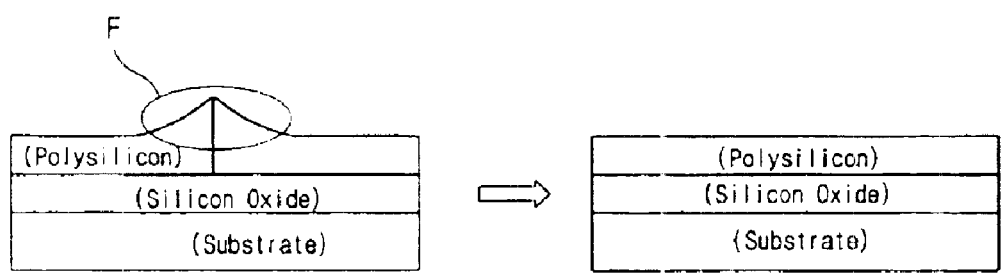
FIG. 8 is a cross-sectional view illustrating a polycrystalline silicon layer formed by the embodiment of the invention compared to that formed by a conventional method.

FIG. 8 is a cross-sectional view illustrating a portion of a polycrystalline silicon layer fabricated using the principles of the present invention. As shown in FIG. 8, the polycrystalline silicon layer formed through the first laser annealing process has a protruding portion "F" formed on the grain boundary region where adjacent grain boundaries contact each other. The protruding portion "F" is melted and re-crystallized by the partially melting process such that the polycrystalline silicon layer becomes flatted. Then, using the method described above, the polycrystalline silicon layer having the flat surface is patterned into the semiconductor layer in the form of an island. Then, source and drain electrodes (not shown) spaced apart from each other are formed to overlap both end portions of the semiconductor layer. Therefore, a switching element according to the preferred embodiment is completely manufactured. In the preferred embodiment of the present invention, an inverted staggered TFT is exemplary explained, but the polycrystalline silicon layer also can be employed in a top gate type TFT.

As described before, by using the method of forming a polycrystalline silicon layer according to the preferred embodiment of the present invention, defects in the grains can be removed and a protruding portion formed on grain boundary regions can be flattened. Therefore, a switching element having excellent electrical characteristics can be obtained.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of forming a polycrystalline silicon layer, comprising:

forming an amorphous silicon layer on a substrate;

melting said amorphous silicon layer using a laser beam so as to form a polycrystalline silicon layer; and re-melting only an upper portion of said polycrystalline silicone layer using a laser beam so as to re-crystallize said upper portion, wherein said re-melting is performed by passing said laser beam though a mask having a low transparency region and a high transparency region.

2. The method of forming a polycrystalline silicon layer according to claim 1, wherein said low transparency region includes a stripe shape.

3. The method of claim 1, further including moving the substrate relative to a laser beam.

4. The method of claim 1, further including dehydrogenating said amorphous silicon layer before melting.

5. A method of forming a polycrystalline silicon layer, comprising:

forming an amorphous silicon layer on a substrate;

melting the amorphous silicon layer using a lass beam thereby forming the polycrystalline silicon layer using a mask, wherein the mask has a completely melting region and a partially melting region; and melting only an upper portion of the polycrystalline silicon layer using the laser beam with the mask thereby recrystallizing the upper portion of the polycrystalline silicon layer, wherein at least some of the melting of the upper portion of the polycrystalline silicon layer is performed as the amorphous silicon layer is melted, ta the completely melting region of the mask pattern is made of a material having a high light transmittance, and the partially melting region of the mask pattern is made of a material having a low light transmittance.

6. A method of forming a TFT-LCD device having a polycrystalline silicon layer, comprising:

preparing a substrate having an amorphous silicon layer and a mask having a pattern of a completely melting region and a partially melting region;

irradiating a laser beam through the completely melting region of the mask onto the amorphous silicon layer so as to form a polycrystalline silicon layer; and then, irradiating a laser beam through the partially melting region of the mask onto the polycrystalline silicon layer so as to re-crystallize the polycrystalline silicon, wherein the completely melting region of the mask pattern includes a material having a high light transmittance, and the partially melting region of the mask pattern includes a material having a low light transmittance.

7. The method of claim 6, wherein the completely melting region and the partially melting region have stripe shapes.

8. The method of claim 7, wherein the completely melting region and the partially melting region are positioned in series.

9. The method of claim 6, further including moving the substrate relative to the laser beam.

10. The method of claim 6, further including dehydrogenating the amorphous silicon layer before melting.

* * * * *